(12) United States Patent
Eberhard

(10) Patent No.: US 10,475,965 B2
(45) Date of Patent: Nov. 12, 2019

(54) OPTOELECTRONIC SEMICONDUCTOR CHIP AND METHOD FOR MANUFACTURING AN OPTOELECTRONIC SEMICONDUCTOR CHIP

(71) Applicant: OSRAM Opto Semiconductors GmbH, Regensburg (DE)

(72) Inventor: Franz Eberhard, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 16/071,876

(22) PCT Filed: Jan. 23, 2017

(86) PCT No.: PCT/EP2017/051320
§ 371 (c)(1),
(2) Date: Jul. 20, 2018

(87) PCT Pub. No.: WO2017/129519
PCT Pub. Date: Aug. 3, 2017

(65) Prior Publication Data
US 2019/0027653 A1    Jan. 24, 2019

(30) Foreign Application Priority Data

Jan. 29, 2016 (DE) ......................... 10 2016 101 612

(51) Int. Cl.
*H01L 33/44* (2010.01)
*H01L 33/42* (2010.01)
(Continued)

(52) U.S. Cl.
CPC .............. *H01L 33/44* (2013.01); *H01L 33/38* (2013.01); *H01L 33/42* (2013.01); *H01L 25/167* (2013.01);
(Continued)

(58) Field of Classification Search
CPC ......... H01L 33/44; H01L 33/38; H01L 33/42; H01L 33/32; H01L 27/14643;
(Continued)

(56) References Cited

U.S. PATENT DOCUMENTS 8,710,536 B2    4/2014 Ibbetson et al.
8,829,560 B2    9/2014 Eberhard et al.
(Continued)

FOREIGN PATENT DOCUMENTS

| DE | 102013113106 A1 | 6/2015 |
| EP | 2403025 A1 | 1/2012 |
| JP | 2012511252 A | 5/2012 |
| JP | 2014127565 A | 7/2014 |
| KR | 20100050430 A | 5/2010 |
| KR | 20130140281 A | 12/2013 |

*Primary Examiner* — Dao H Nguyen
(74) *Attorney, Agent, or Firm* — Slater Matsil, LLP

(57) ABSTRACT

An optoelectronic semiconductor chip and a method for manufacturing an optoelectronic semiconductor chip are disclosed. In an embodiment the semiconductor chip includes a semiconductor body having a main surface and at least one side surface arranged transversely to the main surface, a contact layer arranged on the main surface of the semiconductor body and containing an electrically conductive material, a filter layer arranged on the contact layer and containing a dielectric material and a conductive layer arranged on the filter layer and containing an electrically conductive material, wherein a thickness of the conductive layer is greater than a thickness of the contact layer, wherein the contact layer and the conductive layer comprise a transparent electrically conductive oxide, and wherein the filter layer is multi-layered and comprises at least two sublayers which differ in their refractive index.

17 Claims, 4 Drawing Sheets

(51) Int. Cl.
*H01L 33/38* (2010.01)
*H01L 33/32* (2010.01)
*H01L 27/146* (2006.01)
*H01L 27/32* (2006.01)
*H01L 27/28* (2006.01)
*H01L 25/16* (2006.01)
*H01L 27/14* (2006.01)

(52) U.S. Cl.
CPC ........ *H01L 27/14* (2013.01); *H01L 27/14643* (2013.01); *H01L 27/288* (2013.01); *H01L 27/3227* (2013.01); *H01L 33/32* (2013.01); *H01L 2933/0016* (2013.01); *H01L 2933/0025* (2013.01)

(58) Field of Classification Search
CPC ... H01L 27/3227; H01L 27/288; H01L 27/14; H01L 25/167
USPC .......................................... 257/98, 99; 438/29
See application file for complete search history.

(56) References Cited

U.S. PATENT DOCUMENTS

| | | | |
|---|---|---|---|
| 9,018,656 | B2 | 4/2015 | Murai et al. |
| 9,373,764 | B2 | 6/2016 | Hodota |
| 2007/0145380 | A1 | 6/2007 | Shum et al. |
| 2010/0148199 | A1 | 6/2010 | Kim et al. |
| 2012/0146075 | A1 | 6/2012 | Deguchi |
| 2012/0199861 | A1* | 8/2012 | Tsuji .................. H01L 33/405 257/98 |
| 2012/0223357 | A1 | 9/2012 | Jeon |
| 2014/0197435 | A1* | 7/2014 | Maute .................. H01L 33/382 257/98 |
| 2015/0333230 | A1* | 11/2015 | Moon .................. H01L 27/156 257/88 |
| 2017/0200861 | A1* | 7/2017 | Pfeuffer ................ H01L 33/22 |
| 2019/0027654 | A1* | 1/2019 | Hoppel ................ H01L 33/007 |

* cited by examiner

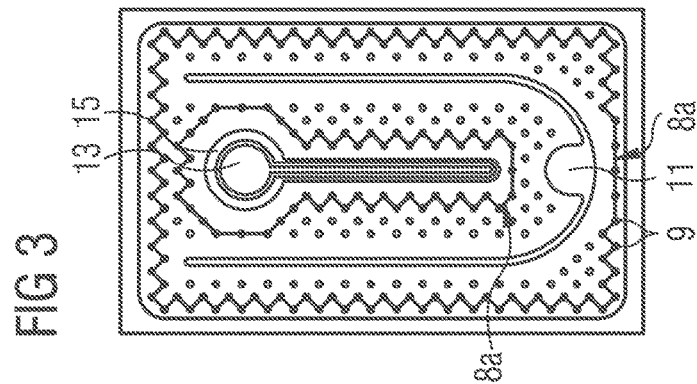
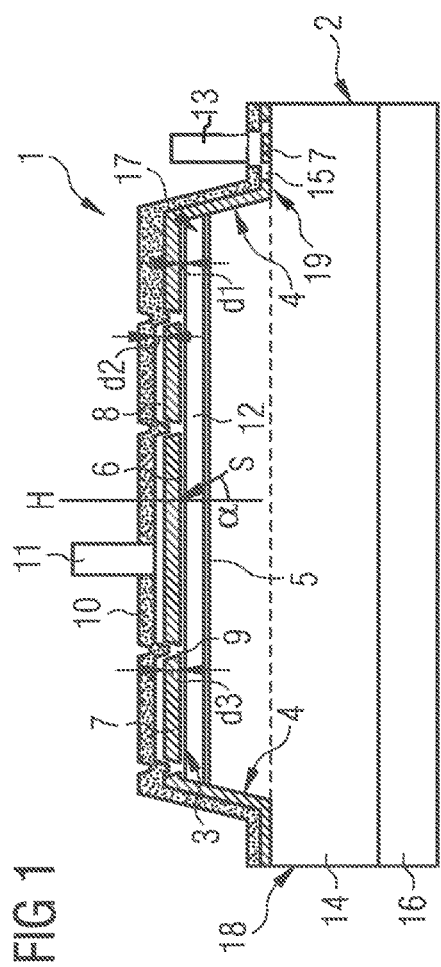
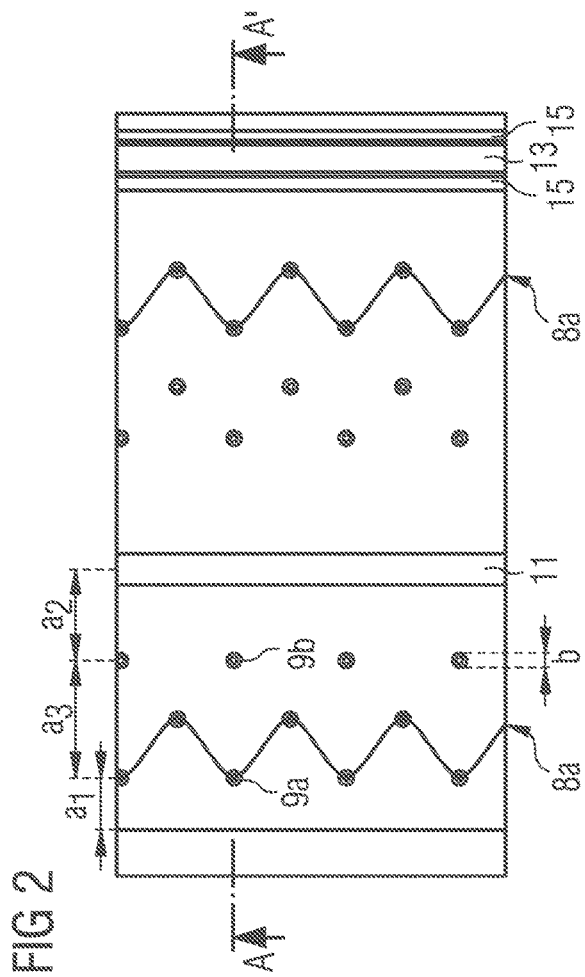

| | M | d (nm) |
|---|---|---|
| 2 | GaN | |
| 6 | ITO | 15 |
| 7A | LRI | 41,38 |
| 7B | HRI | 11,94 |
| 7A | LRI | 453,93 |
| 7B | HRI | 9,81 |
| 7A | LRI | 55,4 |
| 7B | HRI | 28,1 |
| 8 | ITO | 95 |
| V | PRO | |

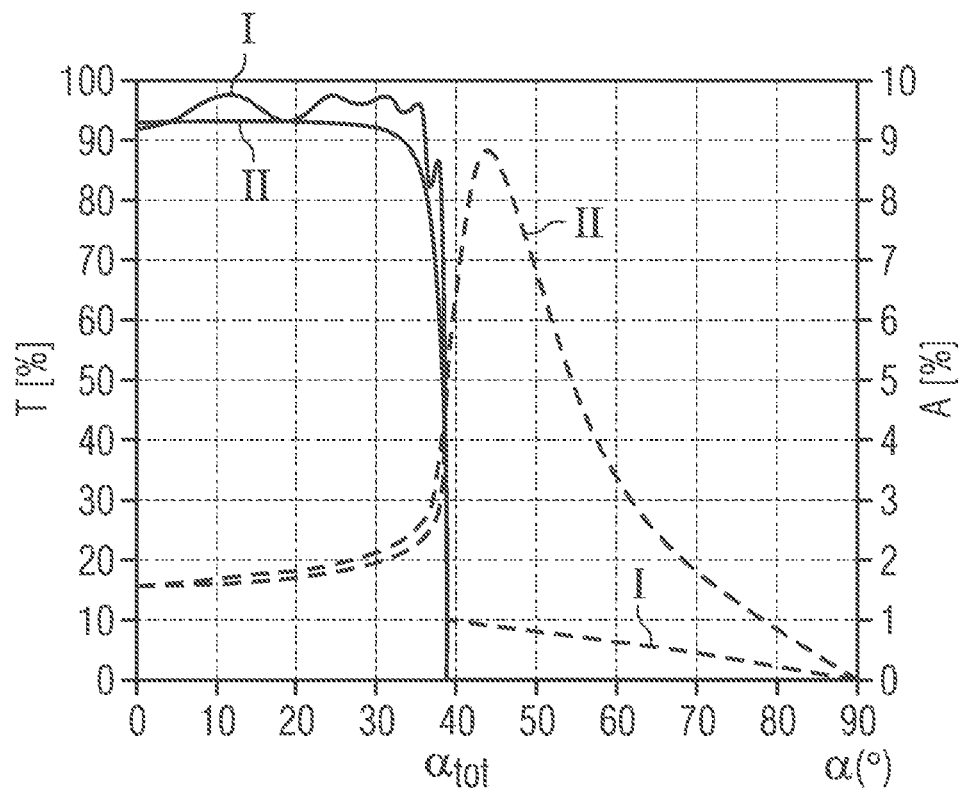

OPTOELECTRONIC SEMICONDUCTOR CHIP AND METHOD FOR MANUFACTURING AN OPTOELECTRONIC SEMICONDUCTOR CHIP

This patent application is a national phase filing under section 371 of PCT/EP2017/051320, filed Jan. 23, 2017, which claims the priority of German patent application 10 2016 101 612.8, filed Jan. 29, 2016, each of which is incorporated herein by reference in its entirety.

TECHNICAL FIELD

An optoelectronic semiconductor chip is provided, which has a semiconductor body with an active zone particularly suitable for the generation of electromagnetic radiation. Furthermore, a method for the production of an optoelectronic semiconductor chip is provided.

BACKGROUND

For example, optoelectronic semiconductor chips are known which have a transparent electrically conductive layer for p-side electrical contacting. If this contact layer is relatively thick and thus enables good electrical conductivity on one hand, it also has a negative effect on the optical properties of the semiconductor chip on the other hand, since radiation is absorbed more strongly in a thicker contact layer.

SUMMARY OF THE INVENTION

Embodiments provide an optoelectronic semiconductor chip in which absorption losses, which occur particularly at a contact structure of the semiconductor chip, are reduced in comparison to a conventional semiconductor chip.

According to at least one embodiment, the optoelectronic semiconductor chip comprises a semiconductor body having a major surface and at least one side surface arranged transversely to the major surface. Furthermore, the semiconductor body comprises an active zone, which is intended for the generation of electromagnetic radiation. In this case, the term "electromagnetic radiation" refers in particular to infrared, visible and/or ultraviolet electromagnetic radiation. During operation, some of the radiation generated passes through the main surface of the semiconductor body. Another part of the radiation can be emitted through the at least one side surface of the semiconductor body. The number of side surfaces is determined by the geometry of the semiconductor body. In an advantageous embodiment of the semiconductor body, it has a mesa-shaped region which is bounded on the upper side by the main surface and on the circumferential side by several oblique side surfaces, in particular four, the side surfaces enclosing an angle which is preferably larger than 90° with the main surface. Furthermore, with this design the semiconductor body can have a cuboid region on which the mesa-shaped region is arranged. In particular, the mesa-shaped region is protruded by the cuboid region in some areas.

According to at least one embodiment, the optoelectronic semiconductor chip comprises a contact layer containing an electrically conductive material. The contact layer is preferably located on the main surface of the semiconductor body. Furthermore, it is advantageous to apply the contact layer in direct contact with the semiconductor body on the main surface. The contact layer is especially designed to establish an electrical contact to the semiconductor body and to inject current into it during operation.

In a preferred embodiment of the semiconductor chip, the semiconductor body comprises a first semiconductor region of a first conductivity type and a second semiconductor region of a second conductivity type, wherein the active zone is located between the first semiconductor region and the second semiconductor region. Both semiconductor regions can have at least one semiconductor layer of the respective conductivity type, but preferably several semiconductor layers of the respective conductivity type. In particular, the main surface on which the contact layer is arranged is a surface of the first semiconductor region. The first semiconductor region is particularly p-conductive, so that the contact layer is intended to inject current into the semiconductor body on the p-side.

In an advantageous embodiment, the mesa-shaped region comprises the first semiconductor region, the active zone and part of the second semiconductor region.

According to at least one embodiment, the optoelectronic semiconductor chip comprises a filter layer containing a dielectric material. In particular, the filter layer is arranged on the contact layer. The dielectric material is an electrically weak or non-conductive, non-metallic material whose charge carriers are generally—for example, within the usual operating currents—not freely movable. The filter layer preferably contains at least one of the following materials: silicon nitride, silicon dioxide, silicon oxynitride, aluminum oxide, titanium oxide, tantalum oxide, niobium oxide.

According to an advantageous embodiment, the filter layer consists of a single layer. In particular, this means that the filter layer is homogeneous and, for example, made of a single dielectric material. The dielectric material has the advantage of an adapted refractive index, where "adapted" means that the refractive index of the dielectric material is greater than or equal to the refractive index of a medium surrounding the filter layer. The surrounding medium is arranged downstream of the filter layer starting from the semiconductor body. The surrounding medium comprises elements that enclose the semiconductor body and in particular have a protective function. For example, the semiconductor body may have a passivation layer and/or encapsulation as the surrounding medium.

In an alternative embodiment, the filter layer is multi-layered and has at least two sublayers with different refractive indices. Preferably, the filter layer comprises a sequence of alternating sublayers with higher refractive index and lower refractive index. In particular, the sublayers with a higher refractive index have a lower thickness than the sublayers with a lower refractive index.

Preferably, the filter layer has a thickness between 400 nm and 800 nm. When dimensioning the thickness of the filter layer, it must be ensured on one hand that the production effort, which is greater with a multi-layer structure of the filter layer than with a single-layer structure, is kept within limits and on the other hand that the desired filter characteristic, which can be better achieved in this case by a multi-layer structure than by a single-layer structure, is achieved. With a thickness between 400 nm and 800 nm, a suitable compromise between production effort and filter characteristics can be achieved. The value ranges specified here and in the following may include the specified limits in particular.

According to at least one embodiment, the optoelectronic semiconductor chip comprises a conductive layer containing an electrically conductive material. Preferably, the conductive layer is arranged on the filter layer. The conductive layer is designed in particular to distribute the current over the main surface. In other words, the conductive layer is characterized in particular by a relatively good electrical transverse conductivity.

According to at least one embodiment, the conductive layer and the contact layer are of different thicknesses. Preferably, the conductive layer has a greater thickness than the contact layer. The thickness of the contact layer is preferably in a range between 5 nm and 25 nm. Furthermore, the thickness of the conductive layer lies in particular between 50 nm and 150 nm. A contact structure formed by the contact layer and the conductive layer is divided into two different functional areas. The thinner contact layer, which makes electrical contact with the semiconductor body but has a lower transverse conductivity than the thicker conductive layer, has the advantage that less radiation is absorbed in it. The thicker conductive layer, on the other hand, ensures good transverse conductivity. The radiation losses, which are typically increased in a thicker layer, can be reduced in this case by the filter layer arranged between the contact layer and the conductive layer. This is because the dielectric filter layer ensures that preferably only radiation that impinges on the filter layer at steep angles reaches the conductive layer. Flat radiation components, on the other hand, which could not be extracted anyway due to the refractive index difference between the semiconductor body and surrounding medium due to total reflections at the transition between the optically denser and the optically thinner medium, are retained by the filter layer as far as possible. As a result, absorption losses in the thicker conductive layer are essentially limited to the angular range capable of propagation. In particular, the filter layer has a filter characteristic which is characterized in that radiation incident on the filter layer at an angle within a first angular range, i.e., at steep angles, predominantly transmits and radiation incident on the filter layer at an angle within a second angular range, i.e., at flat angles, predominantly reflects.

In particular, the boundary between the first angular range and the second angular range is determined by the limit angle of total reflection, which can be derived from the refractive index of the semiconductor body and the refractive index of the surrounding medium. The first angular range includes angles that are smaller than this limit. The second angular range, on the other hand, includes angles that are larger than this limit.

According to at least one embodiment, the filter layer borders directly on the contact layer and the conductive layer. In other words, there is no further layer between the filter layer and the contact layer. Furthermore, there is no further layer between the filter layer and the conductive layer.

With an advantageous embodiment, the contact layer comprises or consists of a transparent electrically conductive oxide. Furthermore, the conductive layer may also contain or consist of a transparent electrically conductive oxide. Preferably, the conductive layer and the contact layer are made of the same material.

Transparent electrically conductive oxides (TCOs) are transparent, conductive materials, usually metal oxides such as zinc oxide, tin oxide, cadmium oxide, titanium oxide, indium oxide or indium tin oxide (ITO). In addition to binary metal oxygen compounds such as ZnO, $SnO_2$ or $In_2O_3$, ternary metal oxygen compounds such as $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent conductive oxides also belong to the group of TCOs. Furthermore, the TCOs do not necessarily correspond to a stoichiometric composition and can also be p- or n-doped.

According to at least one embodiment, the filter layer has at least one opening. In particular, the contact layer and the conductive layer are in contact in the area of the opening. In other words, the conductive and contact layers are electrically connected in the area of the opening. The opening forms a kind of connecting element through which the conductor and contact layer are electrically connected to each other. For example, the opening created can have the shape of an inverted truncated cone. It is also possible that the opening has the shape of an inverted pyramid stump, whereby the pyramid can have an n-angular base with n=3 or larger. Preferably, the opening is limited on the circumference by the conductive layer or the filter layer. The circumferential surface of a truncated cone or pyramid corresponds to the lateral surface. On the underside, i.e., on one side facing the main surface, the opening can be bounded by the contact layer. The opening can be at least partially filled with the material of the conductive layer, so that the contact layer in the area of the opening is completely covered by the conductive layer. Alternatively, an electrically conductive material can be arranged in the opening, which differs from the material used for the conductive layer. In particular, the opening contains a transparent conductive oxide.

The optoelectronic semiconductor chip preferably has a large number of openings. The density and distribution of the openings and the size of the openings can influence the profile of the current imprint in the semiconductor body. For a homogeneous current imprint it is advantageous if edge areas of the main surface are provided with more openings than central areas of the main surface. The distances between the openings can be between 20 μm and 50 μm. A suitable diameter of the openings is between 2 μm and 6 μm. The diameter is the longest lateral dimension for a non-round opening.

According to at least one embodiment, the conductive layer and the contact layer are arranged on the main surface. The filter layer is also arranged on the main surface. Preferably, the conductive layer, the filter layer and the contact layer extend mostly parallel to the main surface. The flat main surface facilitates the formation of the layers.

In a preferred embodiment, the contact layer protrudes laterally over the conductive layer. "Lateral" means parallel to the main surface. In particular, the contact layer extends to the edge of the main surface. Furthermore, it is advantageous to place the conductive layer at a distance from the edge of the main surface.

Furthermore, the filter layer can be arranged at least partially on the at least one side surface of the semiconductor body. The filter layer serves in particular to protect the semiconductor body in the area of the active zone.

According to at least one embodiment, the optoelectronic semiconductor chip comprises a passivation layer arranged on the conductive layer. The passivation layer protects the semiconductor body and the other layers arranged on it from physical and chemical influences. The passivation layer covers the main surface almost completely. In other words, the main surface is completely covered by the passivation layer. Furthermore, the passivation layer can extend to the at least one side surface and at least partially cover it. The passivation layer may be made of a material with a lower refractive index than the conductive layer. For example, the passivation layer may contain or consist of silicon dioxide.

According to at least one embodiment of the optoelectronic semiconductor chip, the semiconductor body comprises a carrier on which the first and second semiconductor regions are arranged. In particular, the substrate is a growth substrate on which the first and second semiconductor regions are epitaxially deposited. In this context, "epitaxial deposition on the growth substrate" means that the growth substrate is used for deposition and/or growth of the first and second semiconductor regions. For example, the second semiconductor area is in direct contact with the growth substrate. Preferably, the growth substrate is not detached after the growth of the first and second semiconductor area, but remains in the semiconductor body.

For the first and second semiconductor region of the semiconductor body, materials preferably based on nitride compound semiconductors are considered. "Based on nitride compound semiconductors" means in this context that at least one layer of the semiconductor regions comprises a nitride III/V compound semiconductor material, preferably $Al_nGa_mIn_{1-n-m}N$, where $0≤n≤1$, $0≤m≤1$ and $n+m≤1$. Without necessarily having a mathematically exact composition according to the above formula. Rather, it may contain one or more dopants and additional components that do not substantially alter the characteristic physical properties of the $Al_nGa_mIn_{1-n-m}N$ material. For simplicity, however, the above formula contains only the essential components of the crystal lattice (Al, Ga, In, N), even if these can be partially replaced by small amounts of other substances.

The carrier or growth substrate preferably comprises or consists of sapphire, SiC and/or GaN. If the growth substrate consists of sapphire, the semiconductor chip described here is a sapphire chip. A sapphire substrate is transparent to short-wave visible radiation, especially in the blue to green range. Since the wavelength of the radiation emitted by the active zone is particularly present in this wavelength range, such a growth substrate is permeable to the radiation emitted by the active zone. In this case, the optoelectronic semiconductor chip is a so-called volume emitter in contrast to a surface emitter.

According to at least one design of the optoelectronic semiconductor chip, it has a first contact element which contains an electrically conductive material and is arranged directly on the conductive layer. Preferably, the first contact element forms an electrical connection of the first semiconductor region of the semiconductor body. By means of the first contact element, current can be injected into the conductive layer. In particular, the first contact element is arranged directly on the conductive layer. The contact layer, the filter layer and the conductive layer are arranged between the first contact element and the main surface. During operation, current is injected into the conductive layer from the first contact element, which passes through the at least one opening in the filter layer to the contact layer. It is advantageous for a homogeneous current imprint if the distance between an opening directly adjacent to the edge of the main surface and the edge of the main surface is smaller than the distance between an opening directly adjacent to the first contact element and the first contact element.

According to at least one embodiment of the optoelectronic semiconductor chip, it has a second contact element which contains an electrically conductive material and is arranged on the second semiconductor region of the semiconductor body with the second conductivity type. In particular, the second contact element forms an electrical connection of the second semiconductor area.

In a preferred embodiment, part of the filter layer is located between the second contact element and the second semiconductor area. The filter layer is designed to reduce radiation losses that can occur at the second contact element through absorption. In particular, the second contact element is arranged vertically on the filter layer from the second semiconductor region, the vertical direction denoting a direction perpendicular to the main surface.

Furthermore, the semiconductor chip preferably has an electrically conductive connection layer which is arranged between the second contact element and the second semiconductor region on a surface of the second semiconductor region. Furthermore, the connection layer is arranged especially between the second contact element and the filter layer. Since the second contact element is electrically insulated from the second semiconductor region by means of the underlying filter layer, an electrical connection between the second semiconductor region and the second contact element is established by means of the connecting layer. The bonding layer may contain or consist of a transparent electrically conductive oxide. In particular, during the production of the semiconductor chip, a layer is applied to the semiconductor body from which the conductive layer and the bonding layer are produced by structuring.

A method of manufacturing an optoelectronic semiconductor chip as described above comprises the following steps in particular:—Providing a semiconductor body with a main surface,—Applying a contact layer to the main surface,—Applying a filter layer to the contact layer,—Applying a conductive layer to the filter layer.

The steps can be carried out in the specified sequence, for example. This process can be used to produce semiconductor chips described here in particular. This means that all the features described for the semiconductor chips are also disclosed for the process and vice versa.

Preferably, the contact layer is applied to the main surface in direct contact. Furthermore, the contact layer has no discontinuities in the area of the main surface. The filter layer, which is applied to the contact layer, can be formed in the area of the main surface with at least one opening. Furthermore, the conductive layer is preferably applied to the filter layer in such a way that the material of the conductive layer penetrates into the opening of the filter layer. The material of the cable layer arranged in the opening is advantageously in contact with the contact layer. At the end of the process, a passivation layer can be applied to the conductive layer.

According to a first embodiment of the process, the filter layer, especially without discontinuities, is formed on the contact layer and then the at least one opening is created in the filter layer. For example, the opening can be made by etching. With this design, the filter layer is therefore only structured after it has been manufactured. Afterwards, the conductive layer can be applied to the filter layer in such a way that it covers it and at least partially fills the at least one opening.

According to a second embodiment of the process, the filter layer is already produced with a structure. A mask is formed on the contact layer, which covers the contact layer in the areas in which the at least one opening is to be created later. The filter layer is deposited in such a way that it is arranged on the mask and the uncovered areas of the contact layer. The conductive layer is then deposited on the filter layer. It is important that the conductive layer covers the side flanks of the filter layer in the uncovered areas and reaches as far as the contact layer. The filter and conductive layer can be produced, for example, by evaporation and/or sputtering. When the mask is removed, which is particularly the result of a so-called lift-off process, at least one opening is created.

BRIEF DESCRIPTION OF THE DRAWINGS

Further features, embodiments and advantages are given in the following description of the exemplified embodiments in conjunction with the figures, in which FIG. 1 is a section of a schematic cross-sectional view of an optoelectronic semiconductor chip according to an embodiment;

FIG. 2 is a section of a schematic plan view of a surface of the optoelectronic semiconductor chip according to the embodiment described in FIG. 1;

FIG. 3 is a schematic plan view of a surface of the optoelectronic semiconductor chip according to the embodiment described in FIG. 1;

FIG. 6 shows a table with specifications for the structure of the conventional semiconductor chip according to the embodiment described in FIG. 5;

FIG. 7 shows the filter characteristics of the optoelectronic semiconductor chip according to the embodiment described in FIG. 1 and the filter characteristics of the conventional semiconductor chip according to the embodiment described in FIG. 5.

DETAILED DESCRIPTION OF ILLUSTRATIVE EMBODIMENTS

Figures 4, 5:
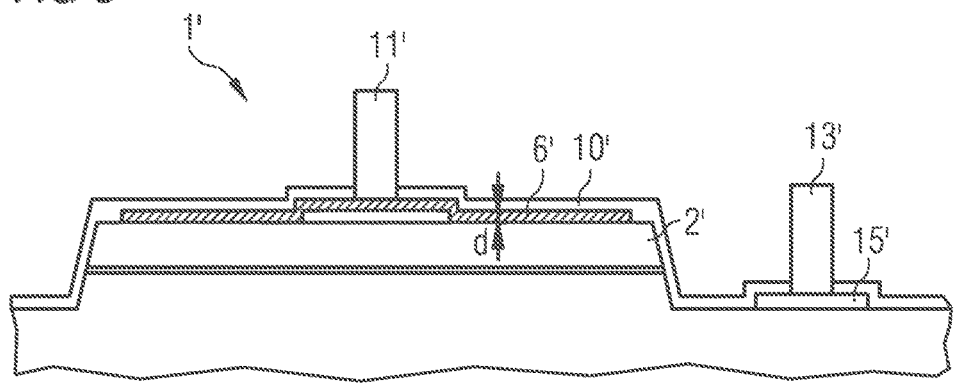
FIG. 4 shows a table with specifications for the structure of the optoelectronic semiconductor chip according to the embodiment described in FIG. 1.
FIG. 5 is a section of a schematic cross-sectional view of a conventional optoelectronic semiconductor chip.

FIG. 1 shows a section of a schematic cross-sectional view of an embodiment of an optoelectronic semiconductor chip 1 described here. The semiconductor chip 1 comprises a semiconductor body 2 with a main surface 3 and several side surfaces 4 arranged transversely to the main surface 3, in particular at an angle greater than 90°. Furthermore, semiconductor body 2 has an active zone 5, which is intended for the generation of electromagnetic radiation S. During operation, some of the generated radiation S passes through the main surface 3 of the semiconductor body 2.

In this embodiment, the semiconductor body 2 has a mesa-shaped region 17, which is bounded at the top by the main surface 3 and at the periphery by oblique side surfaces. Furthermore, the semiconductor body 2 has a rectangular region 18, on which the mesa-shaped region 17 is arranged. The mesa-shaped region 17 is protruded laterally, i.e., in a direction essentially parallel to the main surface 3, at least in some areas by the cuboid-shaped region 18.

The optoelectronic semiconductor chip 1 also comprises a contact layer 6, which is arranged on the main surface 3 of semiconductor body 2. The contact layer 6 contains an electrically conductive material. Preferably, the contact layer 6 contains a transparent electrically conductive oxide. The main surface 3 is covered, in particular for the most part, by the contact layer 6. The advantage of the contact layer 6 is its relatively low thickness d1, whereby the thickness d1 preferably lies in a range between 5 nm and 25 nm. The low thickness d1 of the contact layer 6 reduces absorption in the contact layer 6. Advantageously, such a contact layer 6 allows the transmission of a large part of the radiation S generated by the active zone 5.

The optoelectronic semiconductor chip 1 also comprises a filter layer 7, which is arranged on the contact layer 6. Preferably, the filter layer 7 has a multi-layer structure and in particular has at least two sublayers 7A, 7B (see FIG. 4). Preferably, the sublayers are arranged on top of each other on the main surface 3. In other words, the sublayers extend in particular parallel to the main surface 3, with two adjacent sublayers each having a different refractive index. In particular, the sublayers alternate in such a way that a layer with a high refractive material follows a layer with a low refractive material. In particular, the sublayers with a higher refractive index have a lower thickness than the sublayers with a lower refractive index. Overall, the filter layer 7 can have a thickness d3 between 400 nm and 800 nm.

The optoelectronic semiconductor chip 1 further comprises a conductive layer 8, which is arranged downstream of the filter layer 7 on a side facing away from the main surface 3. Preferably the conductive layer 8 as well as the contact layer 6 is formed of a transparent electrically conductive oxide. However, the conductive layer 8 has a higher thickness d2 than the contact layer 6. In particular, the thickness d2 of the conductive layer 8 is in a range between 50 nm and 150 nm.

Since the conductive layer 8 is thicker than the contact layer 6, it has a better transverse electrical conductivity than the contact layer 6, but usually a thicker layer absorbs more radiation than a thinner layer. However, with the filter layer 7 described above, it is possible to keep the absorption losses in the thicker conductive layer 8 lower than with a conventional semiconductor chip.

The filter layer 7 has the effect that only radiation S, which hits the filter layer 7 at steep angles α, preferably reaches the conductive layer 8. The angles α are determined in particular relative to a main axis H, which is arranged perpendicular to the main surface 3. Flat radiation components, which would be totally reflected anyway when leaving the semiconductor chip 1, are reflected back into the semiconductor body 2 by the filter layer 7.

In addition, the optoelectronic semiconductor chip 1 comprises several openings 9 in the filter layer 7 and the openings 9 are filled with an electrically conductive material. Preferably the openings 9 have the same material as the conductive layer 8, in particular the conductive layer 8 extends into the openings 9 in this embodiment.

The optoelectronic semiconductor chip 1 also comprises a first contact element 11, which is arranged on the conductive layer 8. In particular, the first contact element 11 is arranged directly on the conductive layer 8, with the contact layer 6, the filter layer 7 and the conductive layer 8 being arranged between the first contact element 11 and the main surface 3. The contact element 11 is preferably a metal contact which is arranged on the conductive layer 8 and covers only a small part of the conductive layer 8. As FIG. 3 shows, the contact element can have a U-shaped design.

Semiconductor body 2 comprises a first semiconductor region 12, which is particularly p-conductive. The first contact element 11 preferably forms an electrical connection of the first semiconductor region 12. A second semiconductor region 14, which is in particular n-conductive, can be connected electrically by means of a second contact element 13.

In the embodiment shown in FIG. 1, the mesa-shaped region 17 comprises the first semiconductor region 12, the active zone 5 and part of the second semiconductor region 14. The second semiconductor region 14 is also part of the cuboid region 18. The first contact element 11 is located on the mesa-shaped region 17 and the second contact element 13 is located on the cuboid region 18. As FIG. 3 shows, the second contact element 13 can have an elongated shape and, in particular, can be arranged within an area bounded by the first contact element 11.

Below the second contact element 13, a part of the filter layer 7 is arranged between this and the second semiconductor region 14. By means of the filter layer 7, radiation losses that occur at the second contact element 13 by absorption can be reduced compared to a conventional semiconductor chip (see FIG. 5), which has no filter layer below the second contact element 13'.

Furthermore, semiconductor chip 1 comprises a connection layer 15 which is arranged on a surface 19 of the second semiconductor region 14 and electrically connects the second contact element 13 to the second semiconductor region 14. It is advantageous that connection layer 15 contains a transparent electrically conductive oxide. The connection layer 15 is not only arranged below the second contact element 13, but also covers areas of the surface 19 of the second semiconductor region 14, which are not covered by the contact element 13. Since the second contact element 13 is electrically insulated from the second semiconductor region 14 by means of the underlying filter layer 7, an electrical connection between the second semiconductor region 14 and the second contact element 13 can be established by means of the connecting layer 15 instead.

The first and second semiconductor regions 12, 14 are arranged on a carrier 16. In particular, carrier 16 is the growth substrate on which the first and second semiconductor regions 12, 14 have been deposited. The carrier 16 is preferably a sapphire substrate.

Furthermore, semiconductor chip 1 comprises a passivation layer 10. The passivation layer 10 is arranged on the conductive layer 8 and serves in particular to protect the semiconductor body 2 or the layers 6, 7, 8 arranged on it. The passivation layer 10 covers the main surface 3 and extends over the side surfaces 4 to the cuboidal area 18. For example, the passivation layer 10 contains or consists of silicon dioxide.

FIG. 2 shows a section of a schematic plan view of the mesa-shaped area 17 of the semiconductor chip 1 shown in FIG. 1. FIG. 2 shows the intersection line AA' along which the intersection of FIG. 1 was created. As FIG. 2 shows, the distance a1 between an opening 9a directly adjacent to the edge of the main surface and the edge of the main surface is smaller than the distance a2 between an opening 9b directly adjacent to the first contact element 11 and the first contact element 11. The distances a3 between the openings 9 are preferably between 20 μm and 50 μm. A suitable diameter b, i.e., the longest lateral dimension, the openings 9 is between 2 μm and 6 μm in particular. FIG. 2 also shows the edge 8a of the conductive layer 8. The edge 8a of the conductive layer 8 follows connecting lines between the openings 9 arranged at the edge (compare also FIG. 3). The conductive layer 8 extends to the edge openings 9, with the conductive layer 8 positioned at a distance from the edge of the main surface.

FIG. 3 shows a schematic plan view of a surface of the optoelectronic semiconductor chip as described in FIG. 1. As FIG. 3 shows, the shape of connecting layer 15 is similar to the shape of the second contact element 13, but the two layers 13, 15 differ in size. The connecting layer 15 projects beyond contact element 13 on all sides.

FIG. 4 shows a table in which different parameters are given for the different layers of the semiconductor chip 1 shown in FIG. 1. The first column shows the elements, the second column shows the material M of the corresponding elements, the third column shows the physical thickness d of the elements in nm. As the table shows, the filter layer 7 has a total of six sublayers 7A, 7B, whereby the sublayers 7A are formed from a low refractive index (LRI), while the sublayers 7B are formed from a high refractive index (HRI). For example, the low refractive index of the sublayers 7A may be $SiO_2$ or SiON with a refractive index of n=1.55. Furthermore, the high refractive index material of sublayers 7B may be $TiO_2$ with a refractive index of n=2.49. The surrounding medium V comprises the passivation layer 10 (see FIG. 1) and an encapsulation. For example, the passivation layer may contain silicon dioxide. The encapsulation may also be made of silicone. In particular, the passivation layer and encapsulation have the same refractive index, so that the two layers form an optically homogeneous material (PRO stands for "protection") whose refractive index equals n=1.55. Furthermore, the table shows that the contact layer 6 and the conductive layer 8 are formed from an ITO, with the contact layer 6 having a thickness of 15 nm and the conductive layer 8 having a thickness of 95 nm. In contrast, a conventional semiconductor chip as shown in FIG. 5, for example, has no filter layer. Instead, a conventional semiconductor chip comprises a single contact layer 6', which is the same thickness as the two layers 6 and 8 together (see table in FIG. 6). This leads to higher absorption losses in the contact layer 6' than with the semiconductor chip 1 described here.

FIG. 7 shows the angle-dependent transmission T in % and absorption A in % of a semiconductor chip as described here (see FIG. 1) compared to a conventional semiconductor chip (see FIG. 5). It can be seen that the transmission T of a semiconductor chip as described (curve I with solid line) for angle α with $0° \leq \alpha \leq \alpha_{tot}$, where $\alpha_{tot}$ denotes the limiting angle of total reflection, is increased compared to a conventional semiconductor chip (curve II with solid line). At angles α that are larger than the limit angle $\alpha_{tot}$, the absorption A of a semiconductor chip as described here (curve I with dashed line) is significantly reduced compared to a conventional semiconductor chip (curve II with dashed line). The angle range $0° \leq \alpha \leq \alpha_{tot}$ is the first angle range, while the angle range $\alpha_{tot} < \alpha \leq 90°$ is the second angle range. It should be noted that the first angular range represents a conical area whose axis of symmetry forms the main axis H shown in FIG. 1. The critical angle of total reflection αtot is determined from the refractive index of the semiconductor body and the refractive index of the surrounding medium, where the semiconductor body formed from GaN has a refractive index of n=2.5 and the surrounding medium has a refractive index of n=1.55, resulting in a critical angle $\alpha_{tot} = \arcsin(1.55/2.5) = 38.3°$.

It should be noted that the values for T and A are calculated values and not measured values, the calculation being based on the values given in the tables in FIGS. 4 and 6.

Figure 8:
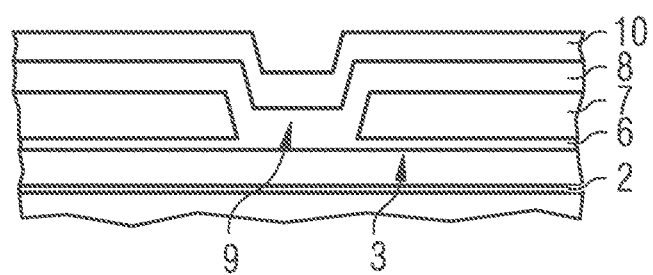
FIGS. 8 and 9 are different embodiments of a process for manufacturing an optoelectronic semiconductor chip as described here.

FIG. 8 is intended in particular to illustrate the production of the filter layer 7, the at least one opening 9 and the conductive layer 8. The individual manufacturing steps of the process are not presented. In the production of filter layer 7, it is applied to contact layer 6, whereby a surface of filter layer 7 facing the main surface 3 is formed in direct contact with contact layer 6. Then the filter layer 7 is structured in such a way that it has at least one opening 9 which extends from a surface of the filter layer 7 facing away from the main surface 3 to a surface of the filter layer 7 facing the main surface 3. In this embodiment, therefore, the filter layer 7 is only structured after its manufacture. For example, opening 9 can be made by etching. Then the conductive layer 8 is applied to the filter layer 7, whereby the conductive layer 8 is applied to the filter layer 7 in such a way that a surface of the conductive layer 7 facing the main surface 3 is in direct contact with the filter layer 7. In particular, during the production of the conductive layer 8, the openings 9 are filled with the material of the conductive layer 8. A connecting element is then formed by the filled opening 9, which connects the conductive layer 8 with the contact layer 6. The connector can be located inside the opening 9 such that it does not protrude beyond the opening 9.

Figure 9:
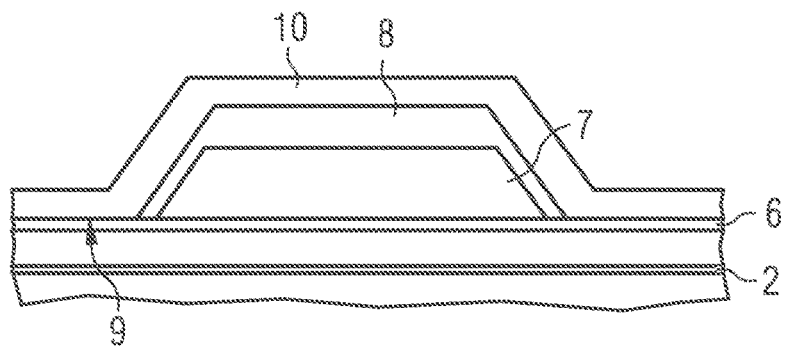

FIG. 9 shows another way of forming the filter layer 7 and the conductive layer 8, in which the filter layer 7 is not subsequently structured as in the embodiment described in FIG. 8, but is already applied in a structured manner. A mask is formed on contact layer 6 (not shown), which covers the contact layer 6 in the areas in which the at least one opening 9 is to be created later. The filter layer 7 is deposited in such a way that it is arranged on the mask and the uncovered areas of the contact layer 6. The conductive layer 8, especially over its entire surface, is then deposited on filter layer 7. The filter and conductive layers 7, 8 can be produced by evaporation and/or sputtering. When the mask is removed, in particular by a so-called lift-off process, the at least one opening 9 is created. At the bottom, the at least one opening 9 is bounded by the contact layer 6, while at the periphery it is bounded by the conductive layer 8. In this embodiment, the passivation layer 10 is also deposited on the conductive layer 8 in such a way that it is also arranged in the at least one opening 9.

The invention is not limited by the description based on the embodiments. Rather, the invention includes each new feature and each combination of features, which includes in particular each combination of features in the patent claims, even if this feature or this combination itself is not explicitly indicated in the patent claims or embodiments.

The invention claimed is:

1. An optoelectronic semiconductor chip comprising:
a semiconductor body having a main surface and at least one side surface arranged transversely to the main surface, the semiconductor body having an active zone for generating electromagnetic radiation and a part of the generated radiation passing through the main surface of the semiconductor body during operation;
a contact layer arranged on the main surface of the semiconductor body and containing an electrically conductive material;
a filter layer arranged on the contact layer and containing a dielectric material; and
a conductive layer arranged on the filter layer and containing an electrically conductive material,
wherein a thickness of the conductive layer is greater than a thickness of the contact layer,
wherein the contact layer and the conductive layer comprise a transparent electrically conductive oxide, and
wherein the filter layer is multi-layered and comprises at least two sublayers which differ in their refractive index.

2. The optoelectronic semiconductor chip according to claim 1, wherein the filter layer comprises at least one opening.

3. The optoelectronic semiconductor chip according to claim 2, wherein the contact layer and the conductive layer are in contact in a region of the opening.

4. The optoelectronic semiconductor chip according to claim 2, wherein the filter layer comprises a plurality of openings, and a distance between an opening directly adjacent to an edge of the main surface and an edge of the main surface is smaller than a distance between an opening directly adjacent to a first contact element and the first contact element.

5. The optoelectronic semiconductor chip according to claim 1, wherein the filter layer has a filter characteristic which is defined such as that radiation which impinges the filter layer at an angle within a first angular range is predominantly transmitted and radiation which impinges the filter layer at an angle within a second angular range is predominantly reflected.

6. The optoelectronic semiconductor chip according to claim 1, wherein the filter layer is directly adjacent to the contact layer and the conductive layer.

7. The optoelectronic semiconductor chip according to claim 1, wherein the filter layer comprises a layer sequence of alternating sublayers having a higher refractive index and a lower refractive index, and wherein the sublayers having a higher refractive index have a smaller thickness than the sublayers having a lower refractive index.

8. The optoelectronic semiconductor chip according to claim 1, wherein the filter layer is arranged at least partially on the side surface.

9. The optoelectronic semiconductor chip according to claim 1, wherein the contact layer and/or the conductive layer consist essentially of a transparent electrically conductive oxide.

10. The optoelectronic semiconductor chip according to claim 1, further comprising:
a first contact element containing an electrically conductive material and being arranged on the conductive layer, wherein the first contact element forms an electrical connection of a first semiconductor region of the semiconductor body with a first conductivity type; and
a second contact element containing an electrically conductive material and being arranged on a second semiconductor region of the semiconductor body with a second conductivity type, wherein the second contact element forms an electrical connection of the second semiconductor region.

11. The optoelectronic semiconductor chip according to claim 10, wherein a part of the filter layer is arranged between the second contact element and the second semiconductor region.

12. The optoelectronic semiconductor chip according to claim 10, further comprising an electrically conductive connecting layer disposed between the second contact element and the second semiconductor region.

13. The optoelectronic semiconductor chip according to claim 12, wherein the electrically conductive connecting layer is arranged between the second contact element and the filter layer.

14. A method for manufacturing an optoelectronic semiconductor chip, the method comprising:
providing a semiconductor body having a main surface;
applying a contact layer to the main surface, the contact layer being formed from an electrically conductive material;
applying a filter layer to the contact layer, the filter layer being formed from a dielectric material; and
applying a conductive layer to the filter layer, wherein the conductive layer is formed from an electrically conductive material,
wherein a thickness of the conductive layer is greater than a thickness of the contact layer,
wherein the contact layer and the conductive layer comprise a transparent electrically conductive oxide, and wherein the filter layer is multi-layered and comprises at least two sublayers which differ in their refractive index.

15. The method according to claim 14, wherein a layer is applied to the semiconductor body from which the conductive layer and a bonding layer are produced by structuring.

16. The method according to claim 14, wherein the filter layer is formed without discontinuities on the contact layer and at least one opening is subsequently produced in the filter layer.

17. The method according to claim 14, further comprising forming a mask on the contact layer which covers the contact layer in areas in which an opening is to be formed in the filter layer, wherein the filter layer is deposited in such a way that it is arranged on the mask and in areas of the contact layer not covered by the mask.

* * * * *